United States Patent
Weathers

(10) Patent No.: US 8,880,976 B2
(45) Date of Patent: Nov. 4, 2014

(54) METHOD AND APPARATUS FOR ENCODING LBA INFORMATION INTO THE PARITY OF A LDPC SYSTEM

(75) Inventor: Anthony Weathers, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 438 days.

(21) Appl. No.: 12/851,465

(22) Filed: Aug. 5, 2010

(65) Prior Publication Data

US 2011/0131467 A1 Jun. 2, 2011

Related U.S. Application Data

(60) Provisional application No. 61/246,002, filed on Sep. 25, 2009.

(51) Int. Cl.
| | |
|---|---|
| *H03M 13/00* | (2006.01) |
| *H03M 13/11* | (2006.01) |
| *H03M 13/29* | (2006.01) |
| *H03M 13/35* | (2006.01) |

(52) U.S. Cl.
CPC ........ *H03M 13/2906* (2013.01); *H03M 13/118* (2013.01); *H03M 13/356* (2013.01); *H03M 13/116* (2013.01)

USPC .......................................... 714/758

(58) Field of Classification Search
USPC .......................................... 714/758
See application file for complete search history.

(56) References Cited

U.S. PATENT DOCUMENTS

| | | | | |
|---|---|---|---|---|
| 5,640,286 | A * | 6/1997 | Acosta et al. | 360/48 |
| 5,805,799 | A * | 9/1998 | Fredrickson et al. | 714/52 |
| 7,174,485 | B2 * | 2/2007 | Silvus | 714/701 |
| 7,647,544 | B1 * | 1/2010 | Masiewicz | 714/770 |
| 7,831,895 | B2 * | 11/2010 | Lin | 714/800 |
| 7,836,379 | B1 * | 11/2010 | Ricci et al. | 714/770 |
| 8,281,224 | B1 * | 10/2012 | Kou et al. | 714/768 |
| 2005/0193320 | A1 * | 9/2005 | Varnica et al. | 714/800 |
| 2006/0020872 | A1 * | 1/2006 | Richardson et al. | 714/758 |
| 2007/0110188 | A1 * | 5/2007 | Esumi et al. | 375/324 |
| 2008/0276156 | A1 * | 11/2008 | Gunnam et al. | 714/801 |

* cited by examiner

Primary Examiner — Philip Guyton

(57) ABSTRACT

Systems and methods for encoding and decoding at least one logical block address in a low density parity check (LDPC) are disclosed. These systems and methods can include selecting a LDPC Code matrix and a parity check matrix wherein the LDPC Code matrix and the parity check matrix have an orthogonal relationship. These systems and methods may further include encoding a data element using at least some of the LBA bits in the parity bits in a LDPC codeword creating a parity vector using the at least some of the LBA bits in the LDPC codeword.

20 Claims, 1 Drawing Sheet

METHOD AND APPARATUS FOR ENCODING LBA INFORMATION INTO THE PARITY OF A LDPC SYSTEM

CROSS-REFERENCE TO RELATED APPLICATION

This application claims priority under 35 USC 119(e) to U.S. provisional Application Ser. No. 61/246,002, filed on Sep. 25, 2009, and which is incorporated herein by reference.

TECHNICAL FIELD OF THE INVENTION

The present application relates generally to Logical Block Addresses and, more specifically, to the use of Logical Block Addresses in various encoders and decoders.

BACKGROUND OF THE INVENTION

A low-density parity-check (LDPC) code is a linear error correcting code. It may be used as a method of transmitting a message over a noisy transmission channel, and is constructed using a sparse bipartite graph.

LDPC codes are capacity-approaching codes, which means that practical constructions exist that allow the noise threshold to be set very close (or even arbitrarily close on the binary erasure channel (BEC)) to the theoretical maximum (the Shannon limit) for a symmetric memory-less channel. The noise threshold defines an upper bound for the channel noise, up to which the probability of lost information can be made as small as desired.

Using iterative belief propagation techniques, LDPC codes can be decoded in time linear to their block length.

SUMMARY OF THE INVENTION

In one embodiment, a method of encoding is disclosed that includes at least one logical block address in a low density parity check (LDPC). This method can include selecting a LDPC Code matrix and a parity check matrix, wherein the LDPC Code matrix and the parity check matrix have an orthogonal relationship, encoding a logical block address (LBA) using at least some of the LBA bits in the parity bits in a LDPC codeword, and creating a parity vector using the at least some of the LBA bits in the LDPC codeword.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
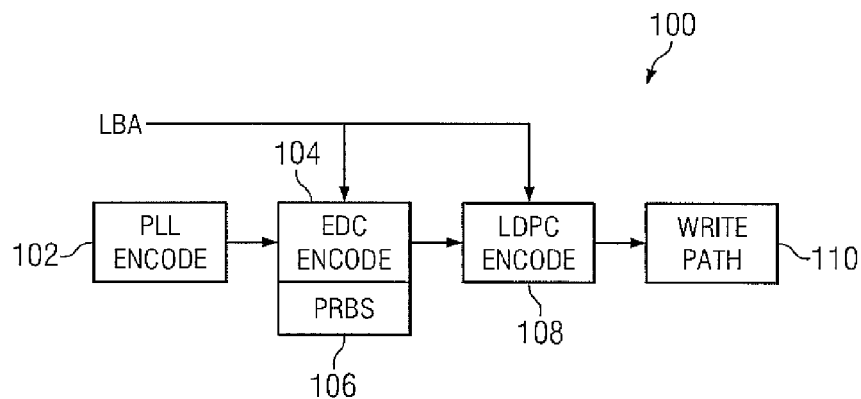
FIG. 1 illustrates LBA usage in a LDPC encoder according to an exemplary embodiment of the disclosure.
Figure 2:
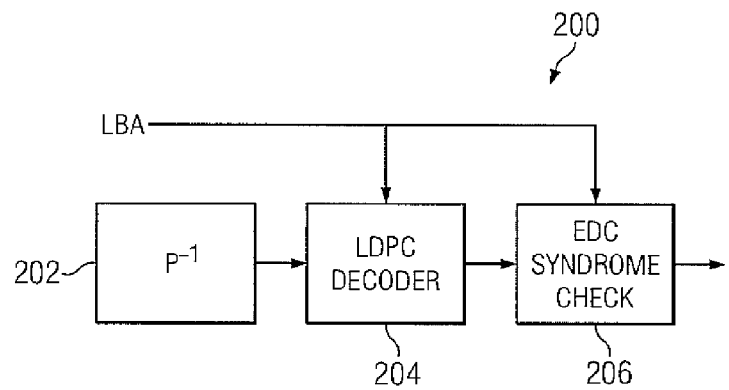
FIG. 2 illustrates LBA usage in a LDPC decoder according to an exemplary embodiment of the disclosure.
Figure 3:
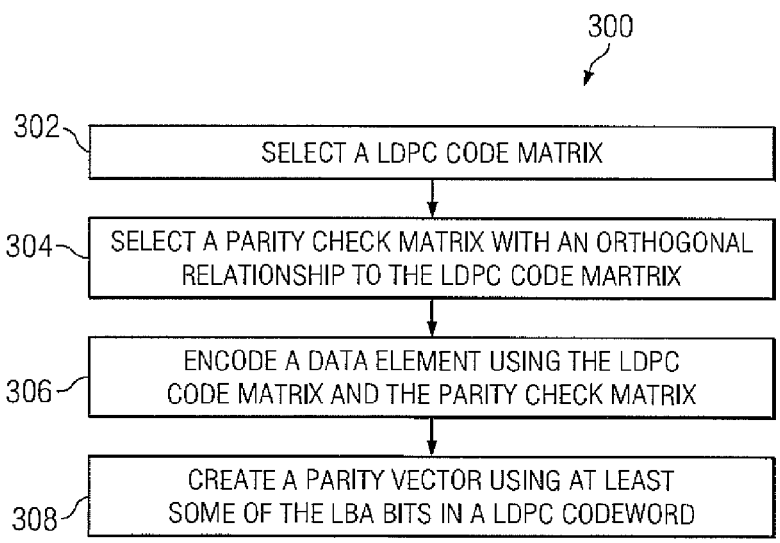
FIG. 3 is a flowchart of one method of using the disclosed embodiments.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged encoder and/or decoder.

Logical Block Address (LBA) is a field received from the host that uniquely identifies each sector. It is given the same protection as the user data with respect to the LDPC code. The LBA is not written to the disk and is supplied by the host to the encoder during a write and to the decoder during a read.

The LDPC encoder takes the output of the error detection and correction (EDC) block with the LBA specified on a parallel path. The encoder generates parity using the LBA as normal user data. This LBA seeded parity is appended to the user data to be written to the disk, but the LBA field is not.

Likewise, the LDPC decoder takes the LBA as an input on a parallel path along with the de-interleaved soft output Viterbi algorithm (SOVA) extrinsic information. The LBA is then included in the LDPC decode function. If the LDPC decode function does not converge, a fault is sent to the host. When the LDPC decode function converges to what is believed to be the correct codeword, the decoded LBA is compared to the expected LBA. If the two values do not agree, a fault is sent to the host. If the two values do agree, the codeword is sent to the EDC syndrome check, which provides another level of protection.

The LBA is a 40 bit field. For 512 byte sectors, the full 40 bits is used to identify the sector. For 4K byte sectors, 38 bits are used to identify each sector and 2 bits are used to identify the 1 K byte blocks within a sector. In a 1 K block, the two 512 byte codewords have the same LBA.

Consider an LDPC Code with systematic generator matrix G, given by Equation 1 below:

$$G = \begin{bmatrix} I & 0 \\ G_p & G_L \\ 0 & I \end{bmatrix}. \qquad [\text{Eqn. 1}]$$

The corresponding parity check matrix, H, is then specified by Equations 2 and 3 below:

$$H = [A\ B\ \Lambda], \qquad [\text{Eqn. 2}]$$

where $$\Lambda = [I\,I\,I\,I]^T. \quad \text{[Eqn. 3]}$$

The relationship between these matrices results from the requirement that they must be orthogonal as specified by Equation 4 below:

$$HG = 0 \Rightarrow \begin{array}{l} G_p = -B^{-1}A \\ G_L = -B^{-1}\Lambda. \end{array} \quad \text{[Eqn. 4]}$$

Thus, given a parity check matrix, H, this expression can be used to calculate the generator matrix. When this process is followed, the encoding process may be represented as described below.

Let u be the user data coming from the EDC Encode block, let L be the LBA bits and let p be the LBA encoded parity. Then, the LDPC codeword is given by the following expression, indicated as equation 5.

$$c = G\begin{bmatrix} u \\ L \end{bmatrix} = \begin{bmatrix} u \\ p \\ L \end{bmatrix} = \begin{bmatrix} u \\ G_L L + G_p u \\ L \end{bmatrix}, \quad \text{[Eqn. 5]}$$

where $$p = G_L L + G_p u. \quad \text{[Eqn. 6]}$$

Although L is officially a part of the codeword, L may not be stored on the disk. It is needed by the LDPC decoder, but it may travel a different path to get there.

As can be seen in Equations 5 and 6 above, the parity calculation requires two components. The first component is dependent on the LEA as shown by Equation 7 below:

$$p_o = G_L L \quad \text{[Eqn. 7]}$$

This component uses GL, a column vector of 4 circulant matrices, to precompute the initial parity vector, $p_o$. This matrix is represented as shown by Equation 8 below:

$$G_L = \begin{bmatrix} G_{L1} \\ G_{L2} \\ G_{L3} \\ G_{L4} \end{bmatrix} = \begin{bmatrix} g_{0,0}^{(L)} & \cdots & g_{0,127}^{(L)} \\ \vdots & \cdots & \vdots \\ g_{511,0}^{(L)} & \cdots & g_{511,127}^{(L)} \end{bmatrix}. \quad \text{[Eqn. 8]}$$

Because the submatrices G are circulants. The calculations can be implemented by shift registers. Four vectors are sufficient to represent this matrix, given as $\{g_{L1}, g_{L2}, g_{L3}, g_{L4}\}$. where the following relationships are shown by Equation set 9 below:

$$g_{L1} = (g_{0,0}^{(L)}, \ldots, g_{128,127}^{(L)})$$

$$g_{L2} = (g_{128,0}^{(L)}, \ldots, g_{0,127}^{(L)})$$

$$g_{L3} = (g_{256,0}^{(L)}, \ldots, g_{256,127}^{(L)})$$

$$g_{L4} = (g_{384,0}^{(L)}, \ldots, g_{384,127}^{(L)}) \quad \text{[Eqn. 9]}$$

The LBA mathematically represents a vector of length 128 where the first 40 bits are the LBA field and the other bits are zero as shown in Equation 10 below:

$$L = [l_0, \ldots, l_{39}, 0, \ldots, 0]^T. \quad \text{[Eqn. 10]}$$

An example of the required operations for the first 128 bits of the initial parity vector is shown as Equation set 11 below:

$$p_{o,0} = l_0 g_{0,0} + l_1 g_{0,1} + \ldots + l_{39} g_{0,39} \quad \text{[Eqn. 11]}$$

$$p_{o,1} = l_0 g_{0,127} + l_1 g_{0,0} + \ldots + l_{39} g_{0,38}$$

$$p_{o,2} = l_0 g_{0,126} + l_1 g_{0,127} + \ldots + l_{39} g_{0,37}$$

$$\vdots$$

$$p_{o,127} = l_0 g_{0,1} + l_1 g_{0,2} + \ldots + l_{39} g_{0,40}.$$

The second component of the parity is calculated the same as the current encoder. The final result is obtained by performing modulo two addition of the result to the initial parity vector shown in Equation 12 below:

$$p = p_o + G_p u. \quad \text{[Eqn. 12]}$$

The LBA decoding operation utilizes the parity check matrix, H, represented as Equation 13 below:

$$H = \begin{bmatrix} H_{0,0} & \cdots & H_{0,37} & I \\ H_{1,0} & \cdots & H_{1,37} & I \\ H_{2,0} & \cdots & H_{2,37} & I \\ I & \cdots & I & I \end{bmatrix}. \quad \text{[Eqn. 13]}$$

With this matrix, the decoder implements 4 layers and 39 circulant columns. The last circulant column, corresponding to the LBA field, will only have 40 log likelihood ratio (LLR) values that participate in the decoding operation. The other values could be treated as zero pads. Since they are always zeros, no hardware need be added representing these locations.

The LBA locations can be pinned by using LLR values 127 or −128 to represent 0 or 1, respectively. Alternatively, the LBA locations can be biased with large values 126 or −127 to represent 0 or 1, respectively. In this case, the LLR values would be allowed to float, and if a valid codeword results, the LBA portion can be compared with the expected LBA values to determine if an error occurs in the LBA portion. Both these options should be supported, and the firmware should be able to select the desired option by a register flag.

The matrices given above were in standard format. For implementation, these matrices will be converted to subcirculant form with 32 sublayers and parallelism 4. The locations of the LBA bits are not changed. The LBA bits are maintained as the first forty bit positions within the LBA circulant column.

In particular embodiments, for the purposes of verification, verify_enc and verify_dec programs are available for block level validation. Additionally, verify_lis is available for LIS level validation.

FIG. 1 is an exemplary diagram of a LDPC encoder 100 which may be used consistent with the present disclosure. As shown in FIG. 1, a phased-locked loop (PLL) encode block 102 feeds a signal into an EDC Encode block 104. The EDC Encode block 104 is coupled to PRBS block 106. The EDC Encode block 104 outputs a signal into a LDPC encode block 108. Both the EDC Encode block 104 and the LDPC encode block 108 receive the LBA. The LDPC encode block 108 outputs a signal into a write path 110.

FIG. 2 is an exemplary diagram of a LDPC decoder 200 which may be used consistent with the present disclosure. A P-1 block 202 introduces a signal into a LDPC decoder 204.

The LDPC decoder 204 outputs the decoded signal into an EDC syndrome check 206. Both the LDPC decoder 204 and the EDC syndrome check 206 receive a signal from the LBA.

FIG. 3 is a flowchart 300 of one method of using the disclosed systems and methods. In block 302, an LDPC code matrix is selected. In block 304, there is a selection of a parity check matrix with an orthogonal relationship to the LDPC code matrix. In block 306, there is an encoding of a data element using the LDPC code matrix and the parity check matrix. In block 308, there is a creation of a parity vector using at least some of the LBA bits in a LDPC codeword.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of encoding at least one logical block address into a low density parity check (LDPC) code, the method comprising:
   receiving, at an LDPC encoder, a logical block address (LBA) at which data is to be stored;
   selecting an LDPC code matrix seeded using the LBA to include a first generator code $G_p$ and a second generator code $G_L$, and a parity check matrix orthogonal to the LDPC code matrix; and
   encoding the data to be stored at the LBA based upon the LDPC code matrix and the parity check matrix by creating a first segment of parity bits using the second generator code $G_L$ and the LBA and creating a second segment of parity bits using the first generator code $G_p$ and the data during encoding, and then combining the first and second segments of parity bits.

2. The method of claim 1, wherein the LBA is a 40 bit field.

3. The method of claim 2, wherein the LBA is specified as an input to the LDPC encoder as a 128 bit vector formed by appending zeroes but is not stored with the data.

4. The method of claim 1, wherein the LDPC encoder generates the first segment of parity bits using the LBA as normal use data and appends the first segment of parity bits to storage of the data within at least one computer readable medium.

5. The method of claim 4, wherein the LBA is not written to the at least one computer readable medium.

6. The method of claim 1, wherein the LBA is provided during a write operation, and
   wherein orthogonality of the LDPC code matrix to the parity check matrix (H) is established when a generator matrix (G) and the parity check matrix satisfy HG=0.

7. The method of claim 1, further comprising:
   creating the parity check matrix using both the LBA and a plurality of circulant matrices.

8. A method, comprising:
   receiving, as inputs to a low density parity check (LDPC) decoder during a read operation on a data element, the data element and a logical block address (LBA) from which the data element was read, wherein the data element comprises data and a parity vector based upon an LBA used in writing the data, wherein the LBA is a 40 bit field;
   during decoding, resolving a first segment of the parity vector using the LBA from which the data element was read and a second segment of the parity vector using the data to obtain at least one decoded LBA generated based on the parity vector; and
   comparing the decoded LBA with the LBA from which the data element was read to verify the data read during the read operation.

9. The method of claim 8, wherein a fault message is sent to a host when the parity vector indicates an error in the data from the data element.

10. The method of claim 8, wherein a fault message is sent to a host when the decoded LBA does not match the LBA from which the data element was read.

11. The method of claim 8, further comprising:
    when the decoded LBA matches the LBA from which the data element was read, sending a decided codeword output by the LDPC decoder to an error detection and correction syndrome check.

12. The method of claim 8, wherein receiving the LBA as an input during a read operation further comprises receiving, from a host, the LBA on a parallel path together with de-interleaved soft output Viterbi algorithm (SOYA) extrinsic information.

13. The method of claim 8, wherein for 512 byte sectors, 40 bits are used to identify each sector.

14. The method of claim 8, wherein for 4 kilobyte sectors, 38 bits are used to identify each sector and 2 bits are used to identify 1 kilobyte blocks within the sectors.

15. A system for encoding at least one logical block address into a low density parity check (LDPC) code, the system comprising:
    a LDPC encoder configured to:
      receive data and a logical block address (LBA) at which the data is to be stored;
      select an LDPC code matrix seeded using the LBA to include a first generator code $G_p$ and a second generator code $G_L$, and a parity check matrix orthogonal to the LDPC code matrix, and
      encode the data to be stored at the LBA based upon the LDPC code matrix and the parity check matrix by creating a first segment of parity bits using the second generator code $G_L$ and the LBA and creating a second segment of parity bits using the first generator code $G_p$ and the data during encoding, and then combining the first and second segments of parity bits.

16. The system of claim 15, wherein the LBA is a 40 bit field.

17. The system of claim 16, wherein the LBA is specified as an input to the LDPC encoder as a 128 bit vector formed by appending zeroes but is not stored with the data.

18. The system of claim 15, wherein the LDPC encoder is further configured to generate the first segment of parity bits using the LBA as normal use data and to append the first segment of parity bits to storage of the data within at least one computer readable medium.

19. The system of claim 15, wherein the LBA is provided during a write operation.

20. The method of claim 8, further comprising one of:
   receiving by a decoder the LBA encoded into the LDPC code; and
   receiving by the decoder the LBA encoded into the LDPC code on a parallel path with the de-interleaved SOVA extrinsic information.

* * * * *